United States Patent [19]
Kopp et al.

[11] Patent Number: 5,932,081
[45] Date of Patent: Aug. 3, 1999

[54] METHOD AND DEVICE FOR GALVANIZING PLATE-SHAPED PRODUCTS IN HORIZONTAL CONTINUOUS PLANTS

[75] Inventors: Lorenz Kopp, Altdorf; Helmut Scharrer, Burgthann, both of Germany

[73] Assignee: Atotech Deutschland GmbH, Berlin, Germany

[21] Appl. No.: 08/849,413

[22] PCT Filed: Feb. 12, 1996

[86] PCT No.: PCT/DE96/00261

§ 371 Date: May 19, 1997

§ 102(e) Date: May 19, 1997

[87] PCT Pub. No.: WO96/24707

PCT Pub. Date: Aug. 15, 1996

[30] Foreign Application Priority Data

Feb. 11, 1995 [DE] Germany ............................ 195 04 517

[51] Int. Cl.⁶ .................................................. C25D 5/00
[52] U.S. Cl. ............................ 205/137; 205/145; 205/81; 205/82; 204/297 R; 204/202; 118/503; 198/341.07
[58] Field of Search ................................ 204/198, 297 R, 204/202, 279, 224 R; 205/137, 145, 152, 81, 82, 96; 118/676, 686, 503; 198/341.03, 341.07, 464.2, 470.1, 803.3

[56] References Cited

U.S. PATENT DOCUMENTS

| | | | |
|---|---|---|---|
| 4,668,358 | 5/1987 | Ball | 204/150.2 |
| 4,776,939 | 10/1988 | Blasing et al. | 204/202 |
| 5,292,424 | 3/1994 | Blasing et al. | 205/82 |
| 5,324,406 | 6/1994 | Anderson et al. | 204/224 R |

FOREIGN PATENT DOCUMENTS

| | | |
|---|---|---|
| 0 254 030 | 6/1987 | European Pat. Off. |
| 0 517 349 | 6/1992 | European Pat. Off. |
| 25 12 762 | 9/1977 | Germany |
| 91 02 321 | 6/1991 | Germany |
| 39 39 681 | 1/1993 | Germany |
| 39 39 256 | 8/1993 | Germany |
| 42 12 567 | 9/1993 | Germany |
| 1266727 | 10/1993 | United Kingdom |

*Primary Examiner*—Kathryn Gorgos
*Assistant Examiner*—Wesley A. Nicolas
*Attorney, Agent, or Firm*—Paul & Paul

[57] ABSTRACT

The invention relates to a method and device for electroplating plate-shaped product, particularly printed circuit boards, in horizontal continuous plants with optional sequence of product, revolving contacting means serving for electrical connection of a source of bath current via wiper rails with the product, and the beginning and end of each individual product item at the inlet to the electroplating plant, and the transport speed of the product, being detected with the aid of sensors, said sensors sending sensor signals to a control system which ascertains whether a product item is present at the gripping point of the contacting means or not, the contacting means being connected electrically and in the electroplating sense in a low-resistance manner to the sources of bath current only when product is present in the region of contacts of the contacting means.

11 Claims, 6 Drawing Sheets

METHOD AND DEVICE FOR GALVANIZING PLATE-SHAPED PRODUCTS IN HORIZONTAL CONTINUOUS PLANTS

BACKGROUND OF THE INVENTION

1. Field of Invention

The invention relates to a method and device for galvanizing plate-shaped products in horizontal continuous plants, particularly for electrolytic treatment of printed circuit boards and printed circuit films.

2. Brief Description of the Prior Art

An arrangement of this type is described in the European Patent Specification 0254030 B1. The products are transported horizontally through the electrolytic plant. The anodes are located along the transport path in the form of plates or cages, which are filled with the metal to be deposited. During its passage through the electrolytic plant, the product is coated in a known way by this metal.

As it enters the electrolytic plant, the plate-shaped product is grasped at its edge by transport members in the form of clamps. The clamps release the product again at the end of the electrolysis chamber. The clamps, secured on an endless revolving transport means, are returned to the inlet to the electrolytic plant.

Apart from transport, the clamps serve also for cathodic contacting of the product during its horizontal passage through the electrolytic plant. For this purpose the plants comprise an electrically conductive material. Furthermore, each clamp is provided, outwith the electrolysis cell, i.e. above the bath level, with a wiper arrangement for transmitting the electrolytic current. Due to the cathodic polarity of the clamp, it is coated with a metal to be deposited within the electrolysis cell just like the product. In order to avoid continual coating during each revolution, the clamps are again de-metallized in a de-metallizing chamber during the return journey. For reasons of system technology, the de-metallizing chamber can only contain the electrolyte which is also located in the electrolysis cell. The electrolyte is optimised for metallization, but not for de-metallization. The massive deposition of metal is frequently not entirely removed by electrolytic de-metallization. In the manufacture of printed circuit boards, it also appears as a disadvantage that the clamps, which are highly electrically conductive and cathodically poled, act as a "thief cathode". The consequence is that the layer deposited on the printed circuit board in the vicinity of the clamps is insufficient. This undesired deposition of metal gives rise to additional consumption of anodes and of energy, particularly for de-metallization.

A further horizontal continuous plant for electroplating printed circuit boards is described in DE 42 12 567 A1. This system uses as a contacting means rods with grippers, which grasp the plates not at the side but at the front edge, drawing them through the plant. The rods are likewise cathodically poled. As a result they are electroplated just like the product. Here also de-metallization is carried out as the rods return to the initial point. The disadvantages named also apply to this contacting means.

In order to avoid the named disadvantages, according to prior art the clamps or rods are covered with an electrically insulating material. This coating covers at least the area of the clamps or rods which projects into the electrolysis cell. Only the area in actual contact with the product, e.g. a printed circuit board, remains without insulation. Materials known in electroplating installations, such as PTFE, are considered as insulating materials; other suitable materials are glass, ceramics and enamel.

It has now become apparent in practice that, in spite of the electrical insulation on the clamps or rods, metal is to some extent still partially deposited. The causes of this are faults in the insulating layer, damage to this layer during use and the necessarily bright metal contact. At these points the field densities are so concentrated that disproportionate metallization takes place. This then cannot be entirely removed in the following de-metallization process, even if attempts are made to operate at this point with a higher current density. When the current density is too high, the electrically conductive connection from the layer to be removed to the clamp or rod burns out, i.e. the undesired deposits on the insulating layer represent a metallic island which can no longer be removed electrolytically, because it only has a high-resistance connection with the metallic base member. This connection however causes a situation in which, upon each passage through the electrolysis cell, growth of the island is to be observed. Despite the insulating layer on the contacting means, and de-metallization after each metallization stage, this leads to a situation in which, due to massive metal deposits, the contacting means must be exchanged from time to time. As these intervals are a few weeks apart, in addition to high costs for working time and replacement material, this also means loss of production.

It occurs in practice that the electroplating plant is not permanently supplied with product. The plant is often set in operation and stopped again after the end of production. In these cases the endless transport of the contacting means must continue at least until the last board has left the system. Over certain distances or over certain periods of time, therefore, contacting means remain in the plant, but no product. The contacting means, which have an ideal cathodic contact, then electroplate particularly intensely at all metallic open points, due to the electrical peak effect. This frequently leads to burns on the deposited metal layers, particularly around the actual contact point, which in this case is not grasping any product. The burns contaminate the electrolyte with microfine metal particles. These particles may only be filtered out with great difficulty. Particles in the electrolyte form nodules in the electrolytic layer on the product.

A method is known from DE 30 39 681 C2 for avoiding burns or excessive deposits on the product and on the contacting means. With respect to the position of the product beneath or above the anodes, these latter are switched on or switched off by means of high-current switching apparatus, so that unacceptably high field line densities on the product are avoided in the case of larger gaps in the sequence of product boards. If there is no product in the vicinity of the anode, then it is switched off. The contacting means which chance to be present at that point are then not exposed to any field line concentration. This effective but technically expensive measure still has a disadvantage with respect to electroplating plants with clamp units: printed circuit boards for example pass through such horizontal systems at a spacing of about 20 millimeters. In practice, the board lengths are variable. Synchronization of the position of the revolving clamps with the position of the printed circuit boards which have passed into the system at optional points in time, is not possible without disadvantage to a homogeneous distribution of layer thickness of the deposited metal. This leads to a situation in which clamps sporadically grasp into such a gap between the workpieces. They are cathodically poled and are located in the area of influence of the switched-on anodes. Faults in the insulating layer on the clamps and the contacts are then particularly intensively electroplated, leading, despite all countermeasures, to the disadvantages described.

The cathode potential of the stationary sources of bath current is transmitted to the revolving clamps by means of wiper brushes. Along the horizontal electroplating plant and parallel to the path of the revolving clamps there is located an extended wiper rail. Each clamp has a wiper brush, which is also known as a wiper contact. The wiper brush produces the electrical connection between the stationary wiper rail and the revolving clamp. This contacting is not required at the turning points of the belt transporting the clamps. Therefore the wiper rail terminates before the turning point. For de-metallization, the clamps are contacted during their return journey via a second wiper rail. In this case the clamps receive an anode potential from a further source of bath current. This wiper rail terminates in front of the second turning point. Thereafter the clamps are again coupled to the described rail with cathode potential for metallization. During an entire revolution of a clamp, therefore, the wiper brush runs twice on to a wiper rail and down again. In this way the supply of electrical bath current is ensured. In addition each clamp must grasp the incoming product by closing the clamps after the turning point at the end of the inlet path. The clamp must again release the material before the start of the outlet turning point. These closing and opening movements are constrained by stationary inclined planes at the turning points, over which correspondingly shaped cams on the clamps are automatically guided. This means that closing and opening are at the same time caused by the drive system for the revolving clamps. A spring in the clamp provides the closing force itself. In known horizontal continuous systems, about 160 clamps at a respective spacing of 80 millimeters are attached on a revolving belt, e.g. on a toothed belt. The automatic guidance is independent of whether product is present or not in the vicinity of the clamps, i.e. whether clamp closure or electrical contacting are required or not. The disadvantages in the method result from this automatically guided arrangement.

The document GB-A-22 66 727 discloses a system for continuous electroplating of printed circuit boards. A product item is continuously electrically contacted in a uniform sequence. There is no provision for switching on and off the contacting means in a controlled manner in dependence on gaps in the product.

A dip bath electroplating plant is known from DE-B-25 12 762, in which product is secured to a revolving chain. At specific turning points in the area of the electrolytic bath, the workpiece carrier is contacted irrespective of whether product is located on the workpiece carrier or not. Upon its entry into the electrolytic bath, no workpiece is individually grasped, but is secured on the workpiece carrier (contacting means) and in this way passes through the entire system with a plurality of treatment stations, without being removed from the chain in the interim.

A device described in DE 39 39 256 C2 is known for protecting the contacting means against undesirable electroplating at the contact. If no printed circuit board is present in the contacting area, the contacting means is closed in such a way that the contact is fully electrically insulated with the aid of a seal member. In practice, printed circuit boards are of different lengths. The contacting means are not synchronized with the transport system for the printed circuit boards. Consequently, the contacting means also occasionally only partly grasp the edge of the printed circuit board. Thus the effect of the sealing element is removed. The contact electroplates at least partially. Furthermore, it occurs that the contacting means grasps the edge of a printed circuit board so ineffectively that the seal member and/or the insulating layers in the contact area are destroyed. The glass fiber reinforced printed circuit boards are extremely rough at their cut edges, and, together with the high contact force, they destroy the insulating means applied thereto.

SUMMARY OF THE INVENTION

With this in mind, the problem underlying the invention is to propose a method and a device which enable product to be transported in an optionally interrupted sequence through a electrolytic horizontal continuous system in such a way, and thus to avoid the disadvantages described, and in particular without metallizing the contacting means.

This problem is solved by the features of the present invention By means of switching on and off in a controlled manner each individual and endlessly revolving contacting means attached to a conveyor belt to and from the cathode potential of the bath current supply in dependence on the position of the product in the area of the grasping contacts of these means, the undesired metallization is avoided. The position of the product is detected by a sensor before its entry into the electroplating plant. A control system follows the material logically as far as the point where the contacting means grip, i.e. clamps. This point is at the same intake point of the plant for all clamps. The endlessly revolving clamps are controlled at the gripping point by the control system in such a way that, when a printed circuit board is present at this point, the clamp is switched in the electrolytic sense with low resistance to cathode potential and at the same time grasps the board. If no incoming printed circuit board is present at this point, then the cathode potential is not applied to the clamp momentarily present at that point. At the same time, the clamp is prevented from closing. This condition is maintained during the passage of the clamp through the metallizing section. The procedure is continuously repeated from clamp to clamp.

This method ensures that a clamp only receives low-resistance cathodic potential when it is required in order to electroplate the product. Faults in the insulating layer of the clamps or in the area of the metallic contact with the printed circuit board then no longer have a concentrating effect on the field lines. These points are electroplated only to the thickness of the product. The de-metallization provided is sufficiently effective for such metallization. If a clamp is not required, the wiper brush of the clamp is also not applied at the gripping point to the cathode potential. However, the clamp is located locally with the metallic bright contact in the electrolyte between the two positive anodes. Due to the lack of low-resistance cathode potential, the metallic clamp located in an insulated manner in the electrolyte adopts, via the open contacts and via the electrolyte, in the electroplating sense, a high-resistance potential, which lies beneath the cathode potential. This means that the switched-off clamp is applied in a high-resistance manner to a lower anode/cathode voltage, as low-resistance, switched-on clamps. Both these factors mean that switched-off clamps have a slight anodic effect relative to the cathodically low-resistance contacted clamps and printed circuit boards, and absorb no electroplating bath current. Therefore electrolytic deposition of metal does not take place on faults in the insulating layer and at the contacts of these clamps as they pass through the metallizing section.

In known electroplating plants, direct currents of up to a few kA are used for electrolytic treatment. Low resistances in the electroplating sense therefore lie in the region of less than 1 milliohm. High resistances begin at a level below 1 ohm.

The controlled switching on and off of the clamps according to the invention is effected by means of the device described in the following:

The wiper brush is secured to the clamp on a movable bracket. A spring presses this bracket into its wiping position, i.e. in the direction of the wiper rail. At the inlet turning point, the clamp secured to an endlessly revolving conveyor belt is opened. This is effected by means of an inclined plane and a slide block running thereon, which is secured to the clamp. At the same time this lifting movement is used to raise the bracket against its spring pressure and out of its wiping position. If, due to product being present at the clamp gripping point, a clamp is required, the clamp closes as it runs down from the inclined plane. At the same time the bracket adopts its wiping position. If the control system determines that no product is arriving at the clamp gripping point, the clamp should then not close and the bracket should not adopt the wiping position with its wiper brush. In this case a barrier, which may be influenced by the control system, ensures that the clamp does not close despite a slide block running down from the inclined plane. At the same time the barrier prevents the bracket from reaching the wiping position. The power for opening and closing the clamps and for raising the bracket against the spring forces is generated by the powerful clamp drive by means of sliding block and inclined plane or by other sliding positively engaging connections such for example as a link motion. The controlled barrier on the other hand requires only minimal force to move it. Thus in this case the use of auxiliary energy such for example as compressed air is suitable here.

The barrier comprises a movable portion, which adopts two conditions, namely "clamp open and bracket not in wiping position", and "clamp closed and wiper brush in wiping position". Apparatus or forces which may be influenced, i.e. switched by the control system, are used in order to adopt these conditions. Electromagnets and compressed air nozzles belong to this category. Spring force or gravitational force can also act on one side of the barrier. It is also possible to actuate the barrier in a contacting manner with the aid of a switch lug. The barrier is so designed that in the open condition of the clamps it can easily adopt the two switching conditions. In one switching point the barrier blocks the clamp closing position. The two spring-operated clamp portions are supported on the barrier. No further energy is required in order to hold them open. In the other switching point of the barrier, the clamp closes in an unhindered manner.

In a construction of the device according to the invention, the barrier comprises an erect and movable catch. The catch is held in the closed position by a weight. Each clamp closes without further actuation. If a clamp is to remain open, the easily-running catch is moved into the blocking position against gravitational force by means of compressed air as it passes an air nozzle. The compressed air is controlled for example by means of a magnetic valve. The point of the action of air on the catch and the duration of the airflow per switching movement are so co-ordinated with respect to the inclined plane, that the clamp portions can be reliably supported on the catch. Thus closure is prevented.

The invention will be further explained with reference to the following substantially schematic drawings.

BRIEF DESCRIPTION OF THE DRAWING FIGURES

FIG. 1: a plan view of a horizontal continuous plant according to prior art;

FIG. 2: the continuous plant according to FIG. 1 with clamps switched-off according to the invention in the gaps between printed circuit boards;

FIG. 3: the interaction of sensors and actuators for controlling the barrier on the clamps;

FIG. 4: a plan view of the area of the printed circuit boards which is not to be grasped by the clamps, and a printed circuit board being gripped, in side elevation;

FIG. 5: a clamp in the three essential switching conditions, i.e. closed, open with free catch, open with engaged catch;

FIG. 6: a clamp according to the invention in a perspective view of a real construction.

DETAILED DESCRIPTION OF THE PREFERRED EMBODIMENTS

Figure 1:
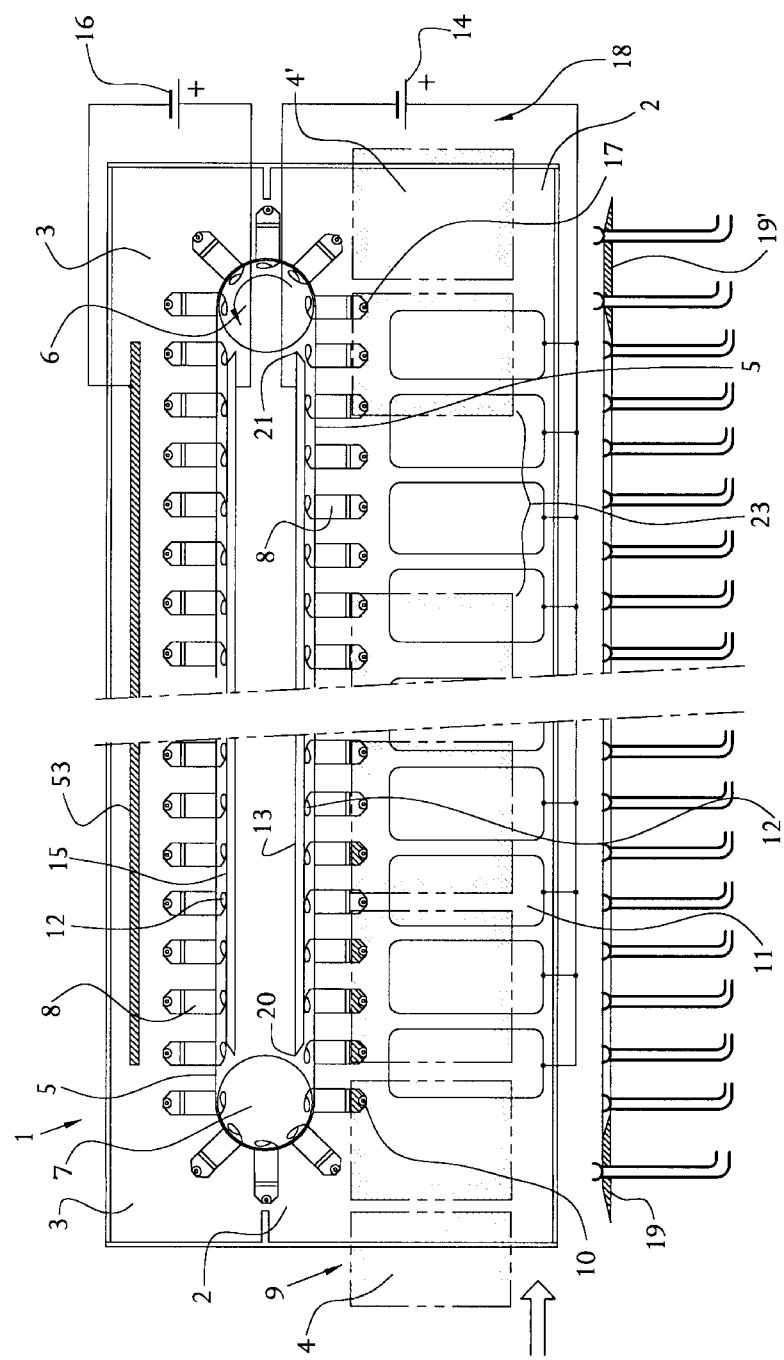

FIG. 1 shows the electroplating plant 1. This is subdivided into the metallizing section 2 and the de-metallizing section 3. The incoming plate-shaped product, for example printed circuit boards, is identified by the number 4, and the outgoing product by 4'. A revolving endless conveyor belt 5, for example a toothed belt, is driven by the drive wheel 6 and turning wheel 7 in one direction and diverted into the other direction by the turning wheel 7. Attached at regular intervals of e.g. 80 millimeters, contacting means in the form of clamps 8 are secured to the conveyor belt 5. After the inlet 9 for the printed circuit boards 4 into the electroplating plant 1, the clamps, at gripping point 10, grip these boards 4 in succession at their edges. They are conveyed horizontally through the system between the anodes 11, which can be soluble or insoluble, on the upper and lower sides. Secured to each clamp 8 is a wiper brush 12, which in the metallizing section produces a sliding electrical contact with the minus pole of the source 14 of electroplating current via the first wiper rail 13. The plus pole of this source 14 of electroplating current is electrically connected to the anodes 11. In the de-metallizing section 3, the wiper brushes 12 of the clamps 8 produce an electrical connection with the source 16 of de-metallizing current via the second wiper rail 15. At the opening point 17, the clamps 8 again release the printed circuit boards 4'. Guided on rollers, they leave the electroplating plant 1 at the outlet 18. The clamps are opened and closed by their running down or running up on inclined planes 19 and 19'. The inclined planes are located along the transport path. They extend as far as the drive wheel 6 and turning wheel 7. The lower portion of FIG. 1 shows the position of the inclined planes with respect to the gripping point 10 and to the opening point 17. The inclined plane 19 is located in the inlet area, and 19' in the outlet area. One half of the clamp 8 runs up on the inclined plane. Thus the clamp opens against the closing force of the clamp spring. At gripping point 10 the clamp is closed again, irrespective of whether a printed circuit board is present at the gripping point 10 or not. The electrical connection with the source 14 of electroplating current is similarly produced thereafter at the contacting point 20 of the wiper rail of the wiper brush. After the clamp 8 passes through the electroplating plant 1 the clamp is again opened by running up on to the inclined plane 19'. At the opening point 17 the printed circuit board 4' is again released, if a board was in fact present in the clamp. Previously the electrical potential has been switched off from the clamp at the end of the wiper rail, at the contact opening point 21.

In the example in FIG. 1, the clamps 8 pass through the de-metallizing section 3, in accordance with prior art, in a closed condition. Plates 53, electrically connected to the source 16 of de-metallizing current, act as precipitation cathodes. The problem in such an electroplating plant is the metallization of the clamps already described. Despite massive electrolytic de-metallization in the de-metallization section 3, it is not always possible to remove again all the metallic deposits. Therefore an attempt is also made to transport the clamps in an open condition through the de-metallizing bath, so that the metal deposits on the contacts grasping the printed circuit boards become more accessible for the field lines. The opened clamp is likewise electrically connected via the wiper brush 12 with the source 16 of de-metallizing current. In order to open the clamp in the de-metallizing section 3, the upper level of the inclined plane 19' is extended from the outlet area of the electroplating plant as far as the inlet area of the same. This measure however does not afford a decisive improvement either. It has in addition the disadvantage that the friction of each clamp on the inclined plane is continued through the entire system as far as the outlet. A consequence of this is lack of ease of running of the drive system, in conjunction with increased wear on the cams.

Figure 2:
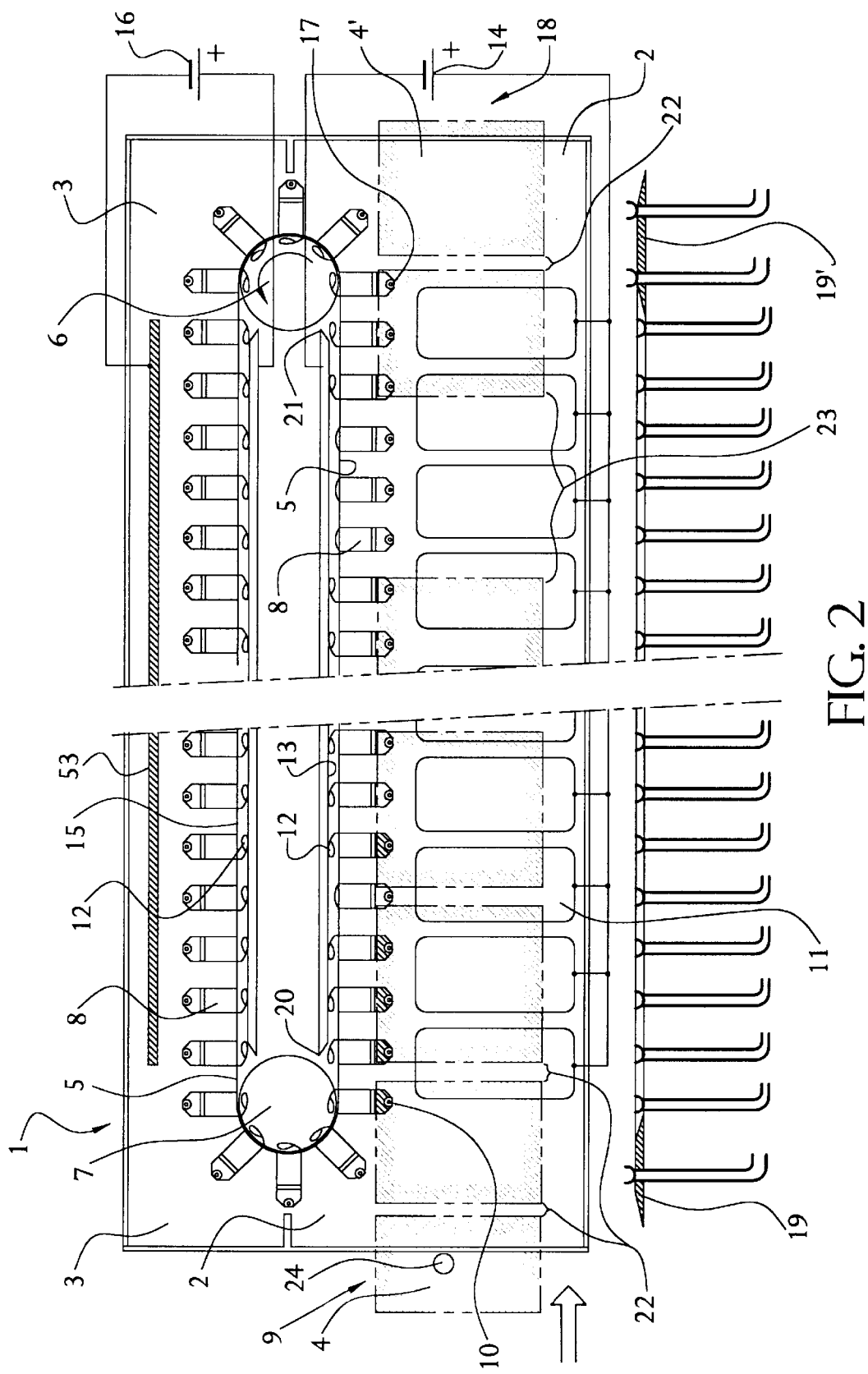

FIG. 2 shows a horizontal continuous plant corresponding to FIG. 1, yet with clamps opened and switched off according to the invention. Where parts are identical or have the same effect, coinciding reference numbers from FIG. 1 have again been used. The printed circuit boards 4 are moved in succession into the electroplating plant 1 at inlet 9. In this entry sequence, spaces are drawn in between the individual printed circuit boards. For reasons of transport and electroplating technology, there is between each printed circuit board a printed circuit board spaces 22.

When there is no product present, printed circuit board gaps 23 result. In practice, printed circuit boards 4 have lengths which differ at least in the transport direction and the system is supplied with product at optional points in time. Therefore it is not possible to synchronize the clamp drive with the sequence of product. Thus clamps 8 are positioned between the printed circuit boards 4, i.e. in the spaces 22 and in the gaps 23. The clamps 8 in spaces 22 and gaps 23 remain open and switched off electrically according to the invention. Clamp opening is shown in the lower portion of FIG. 2, the switch-off of the clamp from cathode potential is represented in the drawing by missing wiper brushes 12 at the relevant clamps.

Figure 3:
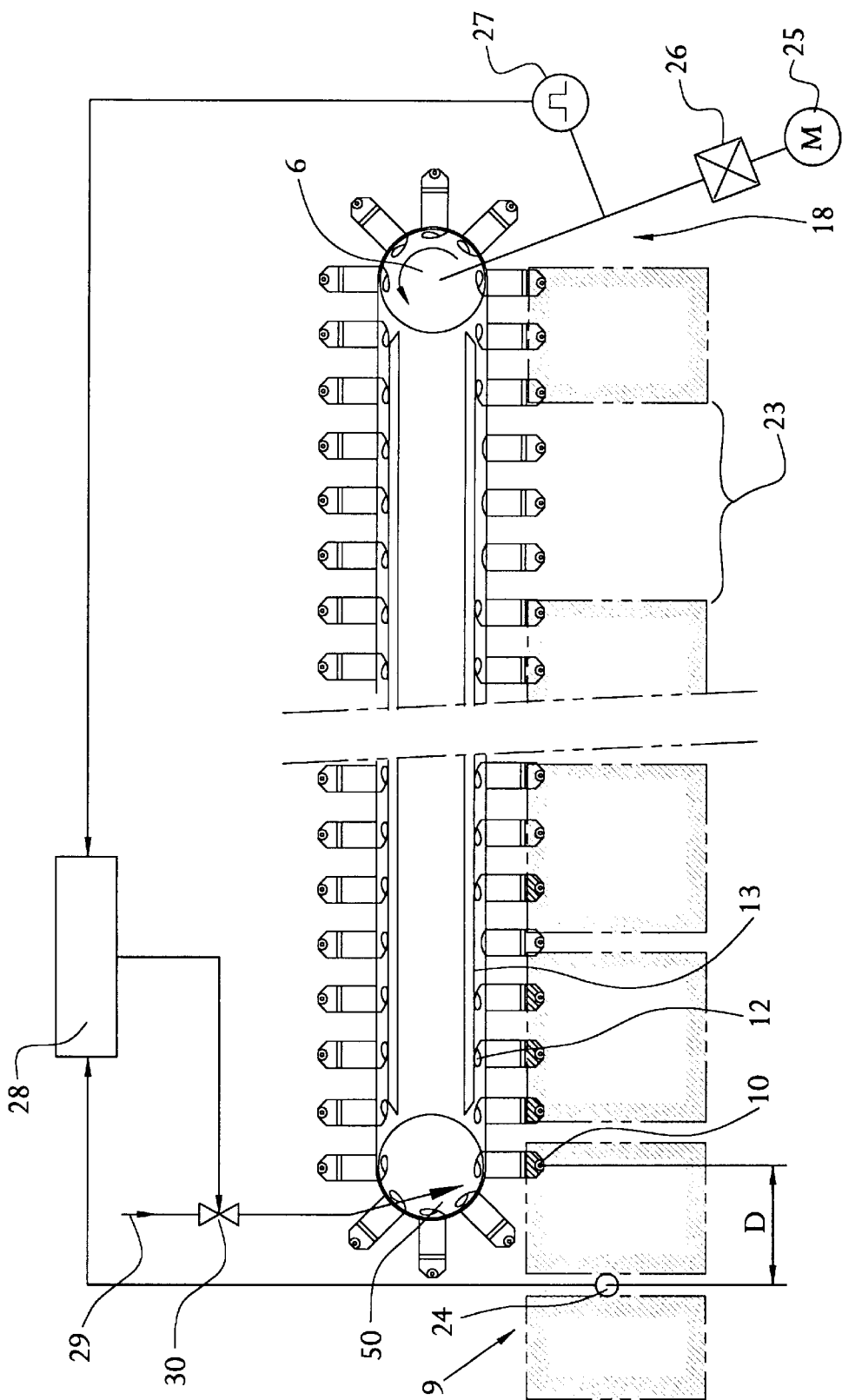

FIG. 3 shows the components necessary for switching off clamps. A printed circuit board sensor 24 in the inlet area of the electroplating plant, e.g. a photoelectric barrier, detects the length of each printed circuit board. This at the same time means that it detects the spaces 22 of the printed circuit boards and the printed circuit board gaps 23. Via the transmission 26 and the drive wheel 6, the motor 25 propels the clamps. These units are identified briefly in common as clamp drives. The motor 25 also synchronously drives the transport rollers (not shown) at the inlet 9 and at the outlet 18 of the electroplating plant. The transport speed of the printed circuit boards depends substantially on the necessary treatment time of the boards in the electroplating plant. In practice it lies at 0.5 to 3 meters per minute. The transport speed at any time is measured by a further sensor. In the example in FIG. 3, this is an incremental distance emitter 27. For example, it emits a pulse for each millimeter of printed circuit board transport path. This distance emitter constant is stored in a control system 28 as a parameter. The control system is for example a memory-programmable control system known per se, also commercially known as programmable logic controller (PLC). The signals at any moment from sensors 24 and incremental distance emitter 27 are continuously detected by the control system 28. The distance D is also stored as a further parameter. Distance D is the constant spacing between the edges of the printed circuit board detected by the printed circuit board sensor 24 and the gripping point 10 of the clamps. Both parameters serve to calculate how many pulses of the incremental distance emitter 27 must pass into the control system 28 until the edge of a printed circuit board, detected by the printed circuit board sensor 24, has arrived at the gripping point 10. This applies both for the ascending side, e.g. for the beginning of a printed circuit board, and for the descending side. With a transport path of 1 millimeter per pulse the number of pulses is equal to the distance D in millimeters. With knowledge of the printed circuit board situation at gripping point 10, the control system 28 controls a barrier which is located on each clamp. Control energy is provided for example by compressed air 29, switched on by the magnetic valve 30 triggered by the SPS. In one switching condition, the barrier releases the clamps for closure, or blocks them in the other switching condition. In the blocked condition, the wiper brush 12 is simultaneously prevented from being applied against the wiper rail 13.

Figure 4:
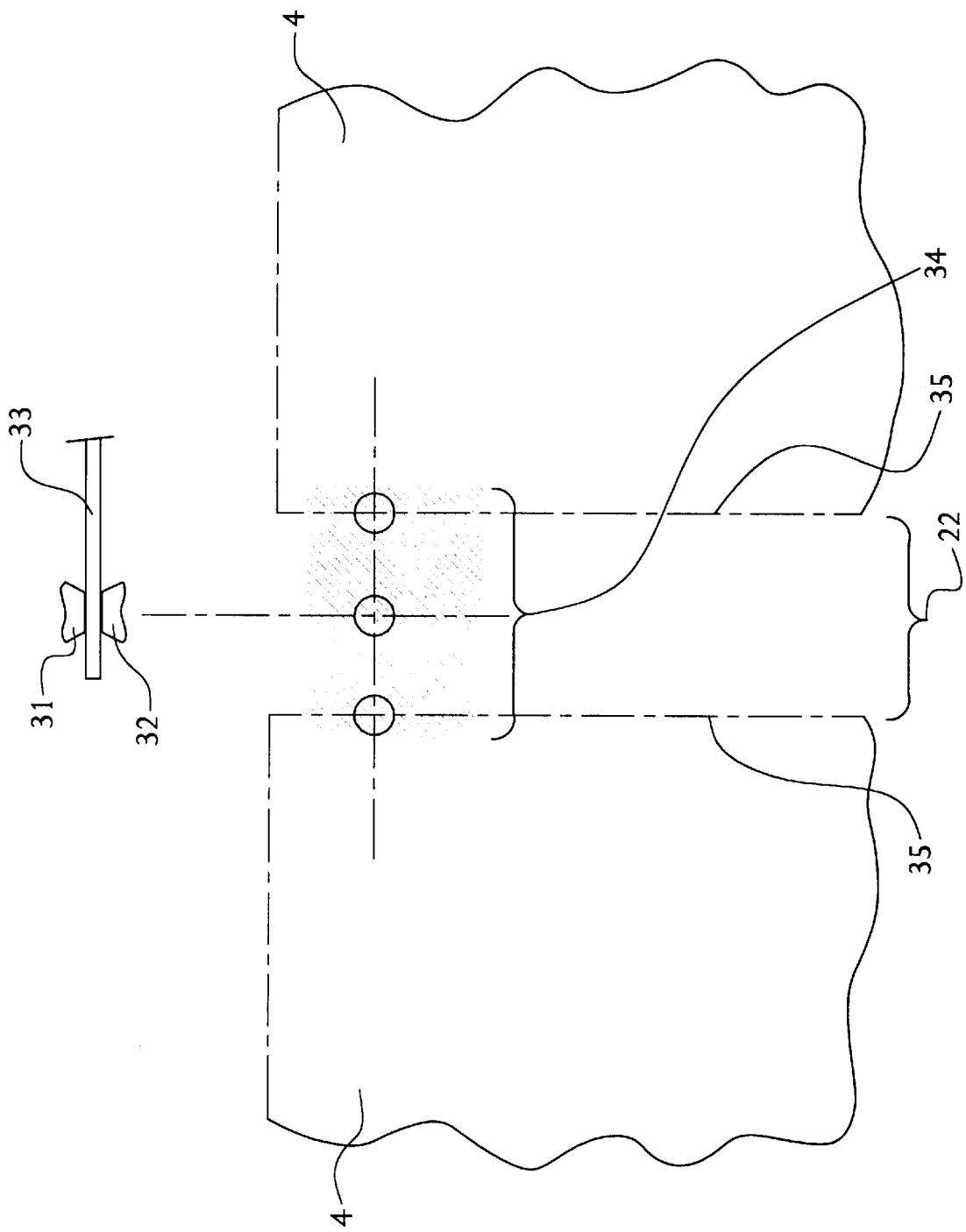

FIG. 4 shows on an enlarged scale the situation at a space 22 of the printed circuit boards in plan view, and the clamp contacts in side elevation. The interval between two printed circuit boards 4 varies in practice between about 0 and 30 millimeters. The upper portion of the clamp has the upper clamp contact 31, and the lower portion the lower clamp contact 32. These grasp the printed circuit board 33. In the cross-hatched area 34, the clamp is not to be closed. Only when the contacts 31 and 32 sit entirely on the printed circuit board 4, 33 should they close. The area 34 is so selected that tolerances do not lead to faulty grasping. In this way it is also ensured that no contact engages on the edge 35 of the printed circuit board. This could displace an incoming printed circuit board from its aligned position on the transport path. This displacement could cause a traffic jam of printed circuit boards.

Figure 5:
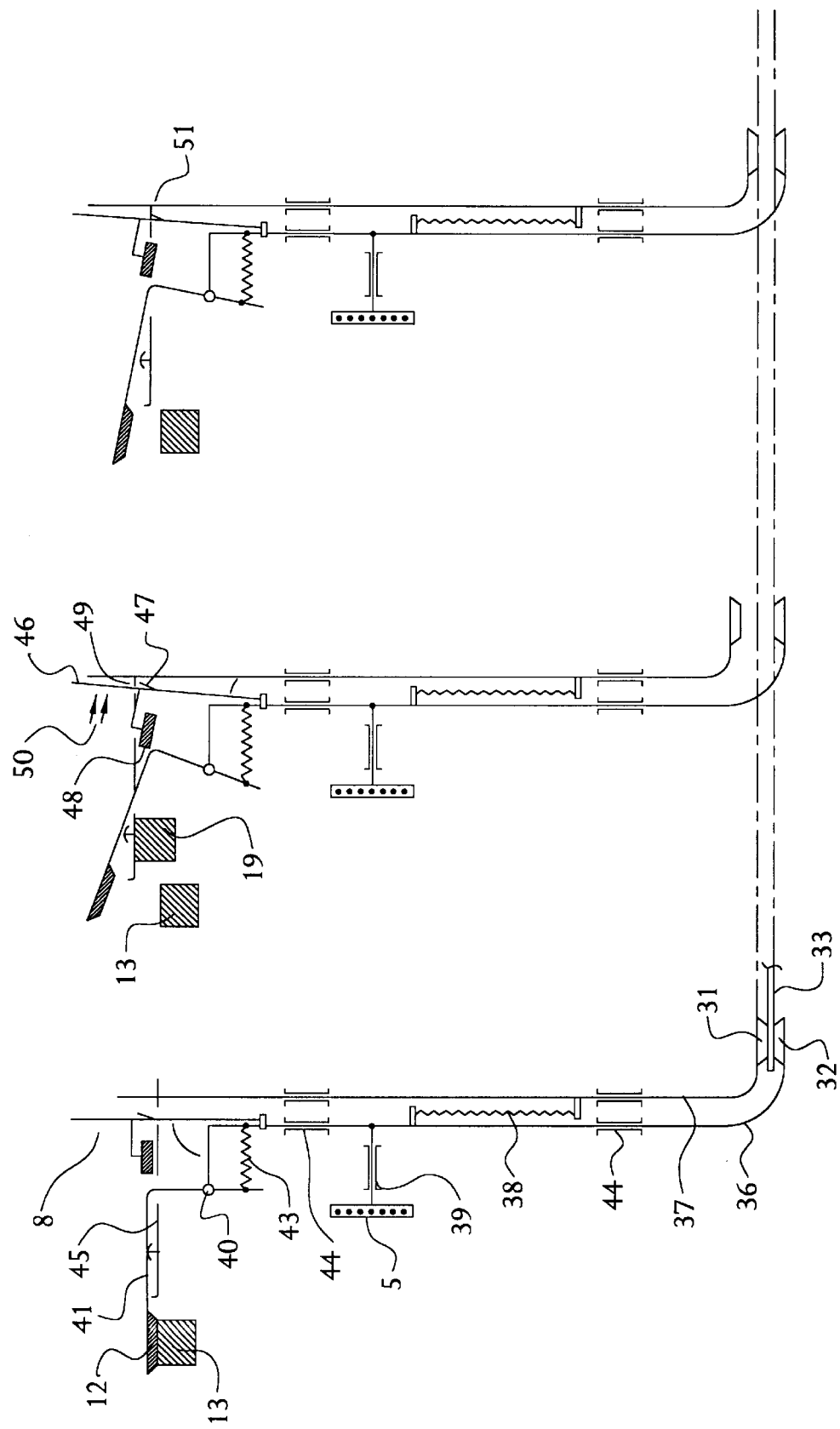

The example in FIG. 5 is intended to explain the switching conditions of the clamp. The clamp 8 comprises the clamp lower portion 36 and the clamp upper portion 37. A compression spring 38 presses the contacts 31 and 32 of both parts against one another. From this there results the closing force of the clamp. The clamp lower portion 36 is guided by a sliding guide 39, and it is secured to the endlessly revolving conveyor belt 5. Located on the portion 36 is a bearing point 40 for the bracket 41, which carries the wiper brush 12. In order to ensure reliable electrical transmission of current, the wiper brush is connected by high-tension braids 52 (FIG. 6) to the clamp portions 36 and 37. The contact bracket 41, the bearing point 40 and the tension spring 43 then only have mechanical functions. The tension spring 43 shown as an example provides the wiper contact force on the wiper rail 13. Guides 44 enable vertical displacement of the clamp upper portion 37 with respect to the clamp lower portion 36. The drive for this is introduced via a slide block 45, which runs up on the inclined plane 19. Thus the wiper brush 12 is raised off the wiper rail 13, as shown in the central portion of FIG. 5. At the same time the clamp opens in the region of its contacts 31, 32. On the clamp lower portion 36 there stands a movable barrier in the form of a catch 46 with a projection 47. The weight 48 holds the catch, which projects through the slide block 45, on its left-hand stop. The aperture 49 is sufficiently large so that, when the catch 45 is moved to the left, the clamp upper portion 37, propelled by the inclined plane 19, can move up and down. If the catch is moved by a current of air 50 out of the position drawn, it moves to the right against the gravitational force of the weight 48. Upon simultaneous dropping of the clamp upper portion 37, the projection 47 of the catch 46 engages in area 51 on the slide block 45. The clamp 8 is blocked. As shown in FIG. 5 on the right side, it remains open even when the inclined plane no longer engages on the slide block 45. If the slide block 45 is again raised from the inclined plane without the current of air 50, the catch 46 drops back. Upon the subsequent lowering, the clamp again closes.

The sequences in FIG. 5 are only an example of the invention. Thus, the functions can also be reversed. The air current on the catch causes closure of the clamp, and the gravity of the weight is used for engagement. The weight of the catch can also be replaced by spring force. Contacting actuation of the barrier is also possible.

Figure 6:
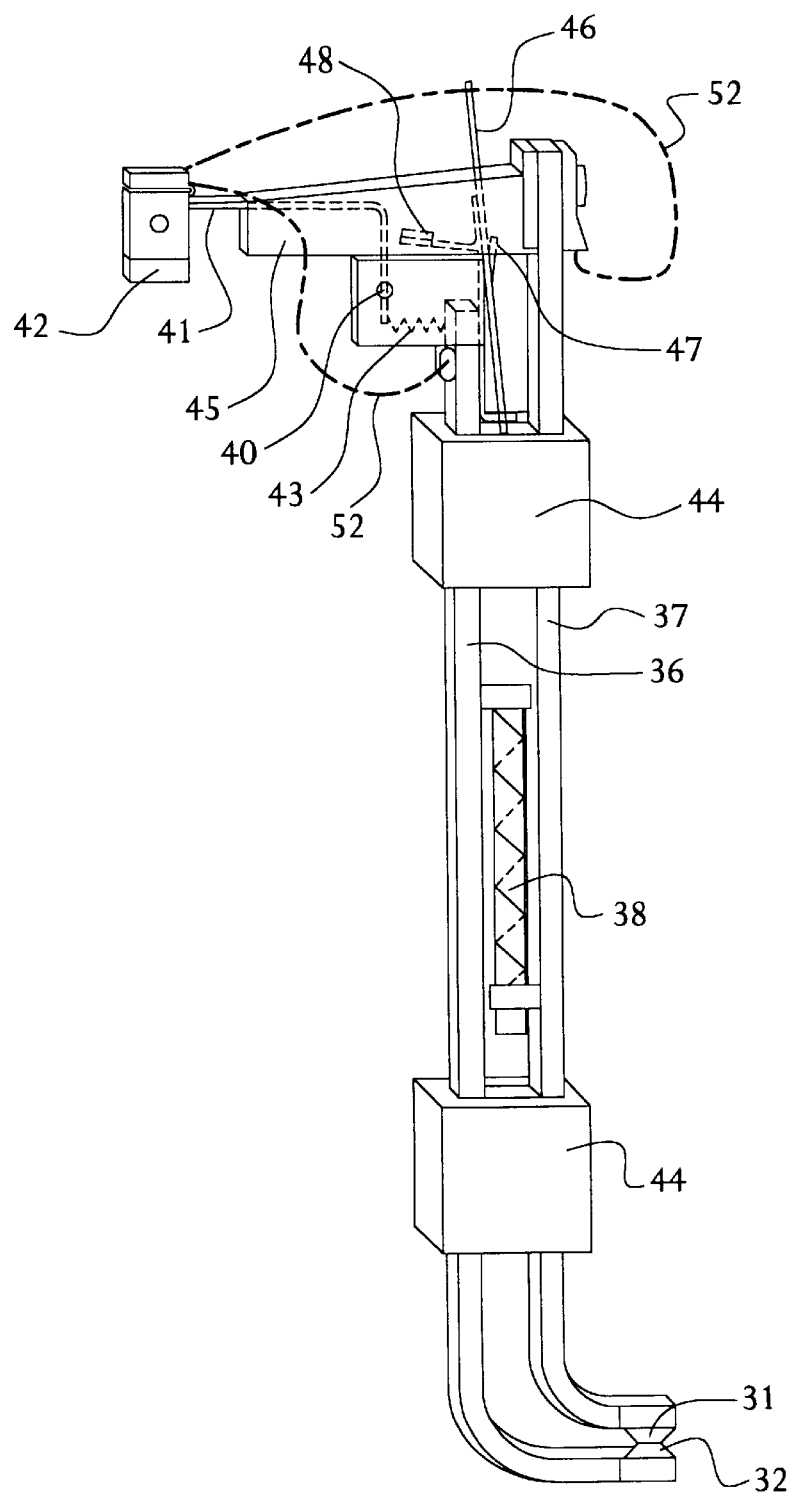

FIG. 6 shows a practical embodiment given by way of example of a clamp 8, as intended to be used in an electroplating plant, and its reference numbers and description corresponding to the layouts according to FIGS. 1 to 5.

We claim:

1. Method of electroplating plate-shaped product, comprising printed circuit boards and printed circuit films, in horizontal continuous plants with optional sequence of product, revolving contacting means serving for electrical contact of a source of bath current via wiper rails with the product, characterized in that with the aid of sensors, the beginning and end of each individual product item are determined at the inlet to the electroplating plant, and the transport speed of the product is determined, the sensors passing sensor signals to a control system which ascertains whether product is present or not at the gripping point of the contacting means, the contacting means being connected in a low-resistance manner electrically and in the electroplating sense with the sources of bath current only when product is present in the vicinity of contacts of the contacting means.

2. Method according to claim 1 characterized in that the control system actuates a closure barrier in the clamp by triggering in dependence on the presence of the product.

3. Method according to claim 2, characterized in that forces for opening the clamps against the spring closing forces are derived from the clamp drive, and auxiliary energy is used only to control the barrier.

4. Method according to claim 2, characterized in that the contacting means is held open by the engaged barrier without auxiliary energy and without consumption of further drive power.

5. Method according to one of claims 1, characterized in that the forces for moving the contacting means are introduced via inclined planes and slide blocks designed for this purpose, or via sliding positive connections.

6. Method according to one of claims 1, characterized in that by means of interrupting the low-resistance electrical contact of the contacting means with the source of bath current, there is established in the metallizing section a high-resistance, in terms of electroplating technology, and lower anode/cathode potential relative to the non-interrupted contacting means, in order to avoid electrolytic deposition of metal on the contacting means even when this latter has metallic bright points.

7. Device for electroplating plate-shaped product, comprising printed circuit boards and printed circuit films in horizontal continuous plants with contacting means for the product, secured to a conveyor belt, drawn or pushed, provided outwith the contacting area with an insulating layer, and which revolve endlessly and, for opening and closing, run up and down on inclined planes, characterized by sensors at the inlet of the electroplating plant, a control system for logical interconnection of sensor signals from the sensors, a two-part clamp for receiving the product, substantially comprising a spring which presses a clamp lower portion against a clamp upper portion only when product is present in the vicinity of the clamp, so that its contact areas electrically contact the product and hold it mechanically, a movable catch on the clamp for initiating closure of the clamp or for blocking it in the opened condition, a controlled drive for moving the catch into a closed position and into a blocked position of the clamp, a sliding block with lever transmission on a bracket rotatably mounted on a bearing point, with a wiper brush, for raising the wiper brush from a wiper rail in the opened condition of the clamp.

8. Device according to claim 7, characterized in that, in order to block the clamp, the catch is provided with a projection which engages in the slide block.

9. Device according to one of claims 7 or 8, characterized by a controlled drive for the catch by means of compressed air, gravitational force, spring force, magnetic force or positive connection for moving the same into the closed position and into the blocked position of the clamp.

10. Device according to one of claims 7 to 8, characterized by electrical connections from the wiper brush to the halves of the clamps in the form of flexible electrical conductors.

11. Device according to one of claims 7 to 8, characterized by a length of the uppermost level of the inclined planes which is selected to be just sufficient to control the catch, in order to avoid unnecessarily long-lasting frictional forces.

* * * * *